US006350326B1

(12) United States Patent
McCay et al.

(10) Patent No.: US 6,350,326 B1
(45) Date of Patent: Feb. 26, 2002

(54) METHOD FOR PRACTICING A FEEDBACK CONTROLLED LASER INDUCED SURFACE MODIFICATION

(75) Inventors: T. Dwayne McCay; Mary Helen McCay, both of Monteagle; Narendra B. Dahotre, Tullahoma, all of TN (US)

(73) Assignee: The University of Tennessee Research Corporation

( * ) Notice: Subject to any disclaimer, the term of this patent is extended or adjusted under 35 U.S.C. 154(b) by 0 days.

(21) Appl. No.: 09/420,675

(22) Filed: Oct. 19, 1999

Related U.S. Application Data

(63) Continuation-in-part of application No. 08/932,022, filed on Sep. 17, 1997, now Pat. No. 5,985,056, which is a continuation of application No. 08/587,553, filed on Jan. 17, 1996, now abandoned.

(51) Int. Cl.[7] .................................................. C21D 1/54
(52) U.S. Cl. ...................... 148/503; 148/511; 148/512; 148/525; 219/121.61; 219/121.62; 219/121.63; 219/121.83
(58) Field of Search ................................. 148/503, 511, 148/512, 525; 219/121.63, 121.64, 121.83, 121.62, 121.8

(56) References Cited

U.S. PATENT DOCUMENTS

| 3,705,758 A | 12/1972 | Haskal |
| 3,848,104 A | 11/1974 | Locke |
| 3,986,767 A | 10/1976 | Rexer et al. |
| 4,015,100 A | 3/1977 | Gnanamuthu et al. |
| 4,017,708 A | 4/1977 | Engel et al. |
| 4,157,923 A | 6/1979 | Yen et al. |
| 4,212,900 A | 7/1980 | Serlin |
| 4,322,601 A | 3/1982 | Serlin |
| 4,434,189 A | 2/1984 | Zaplatynsky |

(List continued on next page.)

FOREIGN PATENT DOCUMENTS

| DE | 4126351 | 2/1993 |
| EP | 876870 A1 | 4/1998 |
| JP | 279692 | 11/1988 |
| JP | 401083676 A | 3/1989 |
| JP | 381082 | 4/1991 |
| JP | 3115587 A | 5/1991 |
| JP | 403115531 A | 5/1991 |
| JP | 5285686 | 11/1993 |
| SU | 1557193 | 4/1990 |
| SU | 1743770 | 6/1992 |
| WO | WO 95/21720 | 8/1995 |
| WO | WO 97/47397 | 12/1997 |

OTHER PUBLICATIONS

Ayers, et al.; "A Laser Processing Technique for Improving the Wear Resistance of Metals," *Journal of Metals*, Aug. 1981, 19–23.

Belvaux, et al.; "A Method for Obtaining a Uniform Non–Gaussian Laser Illumination," *Optics Communications*, vol. 15, No. 2, Oct. 1975, 193–195.

Bett, et al.; "Binary phase zone–plate arrays for laser–beam spatial–intensity distribution conversion," *Applied Optics*, vol. 34, No. 20, Jul. 10, 1995, 4025–4036.

(List continued on next page.)

Primary Examiner—George Wyszomierski
(74) Attorney, Agent, or Firm—Duane, Morris & Heckscher, LLP

(57) ABSTRACT

This invention is directed toward a method of calculating the total laser energy needed to produce one or more selected laser induced surface modification reactions in a substrate moving relative to a laser beam. The present invention is further directed to a method for programming a programmable feedback control system with the calculated total laser energy such that the control system may be used to control laser beam power level and beam width in a process for producing a laser induced surface modification.

18 Claims, 5 Drawing Sheets

U.S. PATENT DOCUMENTS

| | | |
|---|---|---|
| 4,475,027 A | 10/1984 | Pressley |
| 4,480,169 A | 10/1984 | Macken |
| 4,495,255 A | 1/1985 | Draper et al. |
| 4,535,218 A | 8/1985 | Krause et al. |
| 4,617,070 A | 10/1986 | Amende et al. |
| 4,638,163 A | 1/1987 | Braunlich et al. |
| 4,644,127 A | 2/1987 | La Rocca |
| 4,720,312 A | 1/1988 | Fukuizumi et al. |
| 4,724,299 A | 2/1988 | Hammeke |
| 4,746,540 A | 5/1988 | Kawasaki et al. |
| 4,750,947 A | 6/1988 | Yoshiwara et al. |
| 4,801,352 A | 1/1989 | Piwczyk |
| 4,839,518 A | 6/1989 | Braunlich et al. |
| 4,847,112 A | 7/1989 | Halleux |
| 4,898,650 A | 2/1990 | Wu et al. |
| 4,904,498 A | 2/1990 | Wu |
| 4,964,967 A | 10/1990 | Hashimoto et al. |
| 4,981,716 A | 1/1991 | Sundstrom |
| 4,998,005 A | 3/1991 | Rathi et al. |
| 5,059,013 A | 10/1991 | Jain |
| 5,095,386 A | 3/1992 | Scheibengraber |
| 5,124,993 A | 6/1992 | Braunlich et al. |
| 5,130,172 A | 7/1992 | Hicks et al. |
| 5,147,999 A | 9/1992 | Dekumbis et al. |
| 5,196,672 A | 3/1993 | Matsuyama et al. |
| 5,208,431 A | 5/1993 | Uchiyama et al. |
| 5,230,755 A | 7/1993 | Pierantoni et al. |
| 5,247,155 A | 9/1993 | Steen et al. |
| 5,257,274 A | 10/1993 | Barrett et al. |
| 5,265,114 A | 11/1993 | Sun et al. |
| 5,267,013 A | 11/1993 | Spence |
| 5,290,368 A | 3/1994 | Gavigan et al. |
| 5,308,431 A | 5/1994 | Maher et al. |
| 5,314,003 A | 5/1994 | Mackay |
| 5,319,195 A | 6/1994 | Jones et al. |
| 5,322,436 A | 6/1994 | Horng et al. |
| 5,331,466 A | 7/1994 | Van Saarloos |
| 5,352,538 A | 10/1994 | Takeda et al. |
| 5,387,292 A | 2/1995 | Morishige et al. |
| 5,406,042 A | 4/1995 | Engelfriet et al. |
| 5,409,741 A | 4/1995 | Laude |
| 5,411,770 A | 5/1995 | Tsai et al. |
| 5,430,270 A | 7/1995 | Findlan et al. |
| 5,446,258 A | 8/1995 | Mordike |
| 5,449,536 A | 9/1995 | Funkhouser et al. |
| 5,466,906 A | 11/1995 | McCune, Jr. et al. |
| 5,484,980 A | 1/1996 | Pratt et al. |
| 5,486,677 A | 1/1996 | Maischner et al. |
| 5,491,317 A | 2/1996 | Pirl |
| 5,514,849 A | 5/1996 | Findlan et al. |
| 5,530,221 A | 6/1996 | Benda et al. |
| 5,546,214 A | 8/1996 | Black et al. |
| 5,563,095 A | 10/1996 | Frey |
| 5,614,114 A | 3/1997 | Owen |
| 5,643,641 A | 7/1997 | Turchan et al. |
| 5,659,479 A | 8/1997 | Duley et al. |
| 5,874,011 A | 2/1999 | Ehrlich |
| 5,961,861 A * | 10/1999 | McCay et al. ......... 219/121.83 |
| 5,985,056 A * | 11/1999 | McCay et al. .............. 148/511 |

OTHER PUBLICATIONS

Bewsher, et al.; "Design of single–element laser–beam shape projectors," Applied *Optics*, vol. 35, No. 10, Apr. 1, 1996, 1654–1658.

Breinan, et al.; "Processing material with lasers," *Physics Today*, Nov. 1976, 44–50.

Bruno, et al.; "Laserbeam Shaping for Maximum Uniformity and Maximum Loss, A Novel Mirror Arrangement Folds the Lobes of a Multimode Laserbeam Back onto its Center," *Lasers & Applications*, Apr. 1987, 91–94.

Chen, et al.; "The Use of a Kaleidoscope to Obtain Uniform Flux Over a Large Area in a Solar or Arc Imaging Furnace," *Applied Optics*, vol. 2, No. 3, Mar. 1963, 265–571.

Christodoulou, et al.; "Laser surface melting of some alloy steels," *Metals Technology*, Jun. 1983, vol. 10, 215–222.

Cullis, et al.; "A device for laser beam diffusion and homogenisation," J. Phys.E:Sci. Instrum., vol. 12, 1979, 688–689.

Dahotre, et al., "Laser Surface Melting and Alloying of Steel with Chromium," *Journal of Materials Science*, vol. 25, 1990, 445–454.

Dahotre, et al., "Laser Surface Melting and Alloying of Steel with Chromium," *Laser Material Processing III*, 1989, 3–19.

Fernelius, et al.; "Design and Testing of a Refractive Laser Beam Homogenizer," *Airforce Writing Aeronautical Laboratories Report*, (AFWAL–TR–84–4042), Sep. 1984, 46 pages.

Frieden; "Lossless Conversion of a Plane Laser Wave to a Plane Wave of Uniform Irradiance," *Applied Optics*, vol. 4, No. 11, Nov. 1965, 1400–1403.

Galletti, et al.; "Transverse–mode selection in apertured super–Gaussian resonators: an experimental and numerical investigation for a pulsed $CO_2$ Doppler lidar transmitter," *Applied Optics*, vol. 36, No. 6, Feb. 20, 1997, 1269–1277.

Gori, et al.; "Shape–invariance range of a light beam," *Optics Letters*, vol. 21, No. 16, Aug. 15, 1996, 1205–1207.

Grojean, et al.; "Production of flat top beam profiles for high energy lasers," Rev. Sci. Instrum. 51(3), Mar. 1980, 375–376.

Hella, "Material Processing with High Power Lasers," *Optical Engineering*, vol. 17, No. 3, May–Jun. 1978, 198–201.

Ignatiev, et al.; "Real–time pyrometry in laser machining," *Measurement and Science Technology*, vol. 5, No. 5, 563–573.

"Laser Removing of Lead–Based Paint" Illinois Department of Transportation, Jun. 1992, 26 pages.

Jones, et al.; "Laser–beam analysis pinpoints critical parameters," *Laser Focus World*, Jan. 1993, 123–130.

Khanna, et al.; "The Effect of Stainless Steel Plasma Coating and Laser Treatment on the Oxidation Resistance of Mild Steel," *Corrosion Science*, vol. 33, No. 6, 1992, 949–958.

"New Products" *Laser Focus World*, Aug. 1996, 173.

Lugscheider, et al.;" A Comparison of the Properties of Coatings Produced by Laser Cladding and Conventional Methods," *Surface Modification Technologies V*, The Institute of Materials, 1992, 383–400.

Manna, et al.; "A One–dimensional Heat Transfer Model for Laser Surface Alloying of Chromium on Copper Substrate," *Department of Metallurgical & Materials Engineering*, Indian Institute of Technology, vol. 86, N. 5, May 1995, 362–364.

Mazille, et al.; "Surface Alloying of Mild Steel by Laser Melting of Nickel and Nickel/Chromium Precoatings," *Materials Performance Maintenance*, Aug. 1991, 71–83.

Molian; "Characterization of Fusion Zone Defects in Laser Surface Alloying Applications," *Scripta Metallurgica*, vol. 17, 1983, 1311–1314.

Molian; "Effect of Fusion Zone Shape on the Composition Uniformity of Laser Surface Alloyed Iron," *Scripta Metallurgica*, vol. 16, 1982, 65–68.

Molian; Structure and hardness of laser–processed Fe–0.2%C–5%Cr and Fe–0.2&C–10%Cr alloys; *Journal of Materials Science*, vol. 20, 1985, 2903–2912.

"Line–Focussing Optics for Multiple–Pass Laser Welding," NASA Tech Briefs MFS–29976, date unknown.

"Cylindrical Lenses," *Newport Technical Guide*, date unknown, N–65.

"Fused Silica Cylindrical Lenses," *Newport Technical Guide*, date unknown, N–68.

Oswald, et al.; "Measurement and modeling of primary beam shape in an ion microprobe mass analyser," IOP Publishing Ltd., 1990, 255–259.

Renaud, et al., "Surface Alloying of Mild Steel by Laser Melting of an Electroless Nickel Deposit Containing Chromium Carbides," *Materials & Manufacturing Processes*, 6(2), 1991, 315–330.

Smurov, et al.; "Peculiartities of pulse laser alloying: Influence of spatial distribution of the beam," J. Appl. Phys. 71(7), Apr. 1, 1992, 3147–3158.

"Spawr Integrator," Spawr Optical Research, Inc., Data Sheet No. 512, Jun. 1986.

Veldkamp, et al.; "Beam profile shaping for laser radars that use detector arrays," *Applied Optics*, vol. 21, No. 2, Jan. 15, 1982, 345–358.

Veldkamp; "Laser Beam Profile Shaping with Binary Diffraction Gratings," *Optics communications*, vol. 38, No. 5,6, Sep. 1, 1981, 381–386.

Veldkamp; "Laser beam profile shpaing with interlaced binary diffraction gratings," *Applied Optics*, vol. 21, No. 17, Sep. 1, 1982, 3209–3212.

Veldkamp; "Technique for generating focal–plane flattop laser–beam profiles," Rev. Sci. Instru., vol. 53, No. 3, Mar. 1982, 294–297.

Walker, et al.; "Laser surface alloying of iron an 1C–1.4Cr steel with carbon," *Metals Technology*, vol. 11, Sep. 1984, 5 pages.

Walker, et al.; "The laser surface–alloying of iron with carbon," Journal of Material Science vol. 20, 1985, 989–995.

Wei, et al.; "Investigation of High–Intensity Beam Characteristics on Welding Cavity Shape and Temperatuer Distribution," Journal of Heat Transfer, vol. 112, Feb. 1990, 163–169.

Charschan, "Lasers in industry," *Laser Processing Fundamentals*, (Van Nostrand Reinhold Company), Chapter 3, Sec. 3–1, 139–145.

Fernelius, et al; "Calculations Used in the Design of a Refractive Laser Beam Homogenizer," *Airforce Writing Aeronautical Laboratories Report*, (AFWAL–TR–84–4047), Aug. 1984, 18 pages.

Jain, et al.; "Laser Induced Surface Alloy Formation and Diffusion of Antimony in Aluminum," *Nuclear Instruments and Method*, vol. 168, 275–282, 1980.

Molian; "Estimation of cooling rates in laser surface alloying processes," Journal of Materials Science Letters, vol. 4, 1985, 265–267.

"High Power CW Nd:YAG Laser Transformation Hardening," Hobart Laser Products, 2 pages.

ASM Handbook, vol. 6, Welding, Brazing, and Soldering, 1993.

Conde, O., et al., "Laser Chemical Vapor Deposition of Titanium–Based Hard Coatings", from *Laser Processing: Surface Treatment and Film Deposition*, pp. 665–691, 1996.*

Hateiapostolou, A., et al., "Process Control of Laser Chemical Vapour Deposition of TiC on Tool Steel", from *Laser Processing: Surface Treatment and Film Deposition*, pp. 703–710, 1996.*

Kar, A., et al., "Modeling in Laser Materials Processing: Melting, Alloying, Cladding", from *Laser Processing: Surface Treatment and Film Deposition*, pp. 129–155, 1996.*

* cited by examiner

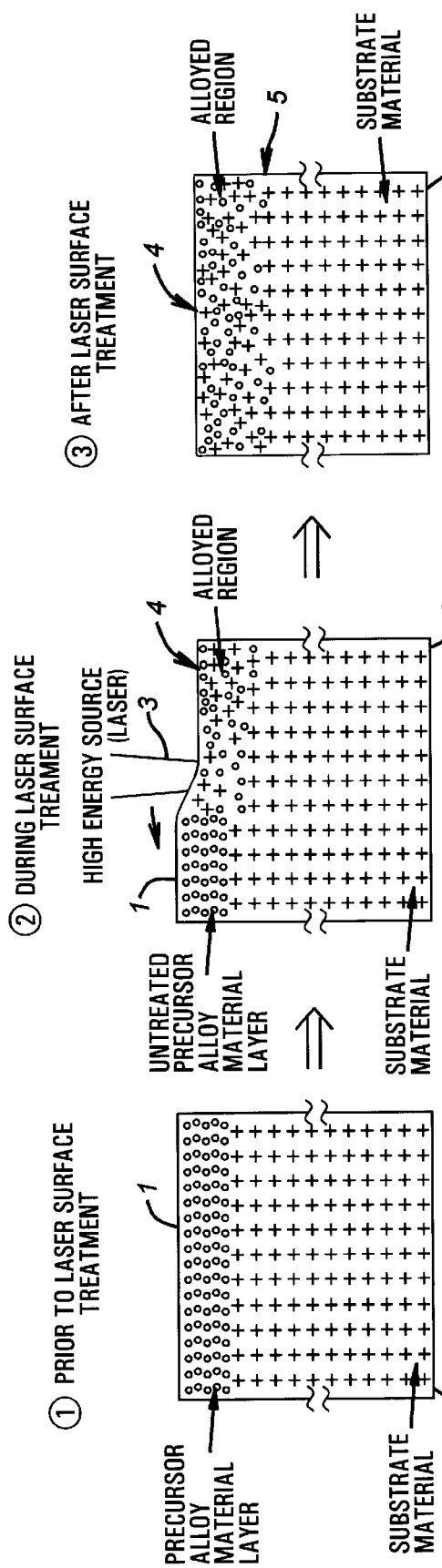
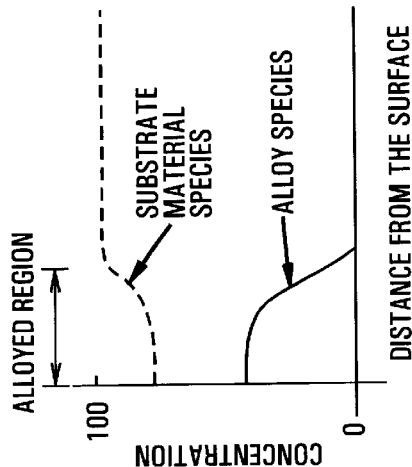
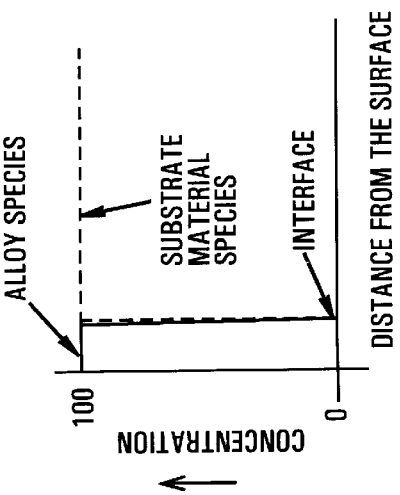

METHOD FOR PRACTICING A FEEDBACK CONTROLLED LASER INDUCED SURFACE MODIFICATION

CROSS REFERENCE TO RELATED APPLICATIONS

This is a continuation-in-part of application Ser. No. 08/932,022 filed on Sep. 17, 1997, now U.S. Pat. No. 5,985,056, which is a continuation application of application Ser. No. 08/587,553 filed on Jan. 17, 1996, now abandoned.

BACKGROUND OF THE INVENTION

1. Field of the Invention

This invention is directed toward a method of calculating the total laser energy needed to produce one or more selected laser induced surface modification reactions in a substrate moving relative to a laser beam. The present invention is further directed to a method for programming a programmable feedback control system with the calculated total laser energy such that the control system may be used to control laser beam power level and beam width in a process for producing a laser induced surface modification.

The present invention relates to the field of treating metallic surfaces subject to wear, oxidation, corrosion and rusting.

2. Description of the Prior Art

In the past, substrate materials have been irradiated at preselected power levels in order to produce a laser induced surface modification. It is desirable to control the depth and chemistry of laser modifications produced by such processes. Prior art methods of practicing laser induced surface modifications have failed to incorporate a dynamic feedback control system for controlling variables such as laser power, laser beam width, or the rate of movement of the substrate being irradiated relative to the laser beam in order to control the laser induced surface modification.

Prior art methods of practicing laser induced surface modification have failed to calculate the total laser energy needed for one or more specific preselected reactions and then to program a feedback control system to operate a laser at that selected power level. The present invention provides such a method of programming a feedback control system in order to practice a laser induced surface modification.

Exposed metallic surfaces, such as steel and aluminum, are subject to corrosion, rust, hydrogen embrittlement and wear flash erosion. Typically, these surfaces are protected by painting, cladding, coating or electroplating the surface. These methods, however, require frequent reapplication and are subject to flaking and separation of the protective layer from the substrate surface at the junction of the protective layer and the substrate.

SUMMARY OF THE INVENTION

The present invention is directed toward a method of calculating the total laser energy needed to produce one or more selected laser induced surface modification reactions in a substrate moving relative to a laser beam. The term "reaction(s)" is used herein to refer to one or more reactions. The invention comprises selecting a reaction(s) to be induced, selecting the temperature, T, at which each selected reaction shall take place, and determining the free energy of formation, FEF, of each selected reaction at the selected temperature for each reaction.

The invention further comprises selecting the depth of the surface modification, D, selecting the volume fraction, VF, of the surface modified layer, and selecting the translation rate, TR, of the relative movement of the substrate with respect to the laser beam. The phrase "relative movement", as used herein, encompasses movement of the substrate relative to a stationary laser beam, movement of a laser beam relative to a stationary substrate, and movement of both the laser beam and the substrate.

The invention further comprises determining the coating species theoretical density, CSD, based upon the selected reaction(s), selecting the laser beam width, BW, and calculating the mass of alloying coating species, MAS, needed.

The method of the present invention further comprises calculating the total laser energy, TLE, needed to produce the surface modification having the volume composition, VF.

The present invention provides metallic surfaces subject to wear, oxidation, corrosion and rusting with a surface alloy layer for protecting such metallic surfaces without the flaking and separation, and the need for frequent reapplication, of prior surface treatments.

This and other objects are achieved in accordance with the present invention with a process by which a metal substrate surface is treated or otherwise protected from wear, corrosion by the formation of an alloy in the surface and subsurface of the substrate. The alloy forms an integral part of the substrate, in contrast to other methods of protecting metal surfaces, such as coating, cladding, painting and electroplating.

According to the process of the present invention, which will be referred to as "laser induced surface improvement" (or the LISI process), a desired alloying metal is applied to a metal surface to be treated, and is irradiated by means of a laser beam. The process results in the formation of an alloy in the surface of the metal. The major components of a system for performing the process of the present invention are a laser, a corresponding delivery system, a movement system, a control system (including quality control), and a precursor alloying material, such as a powder in a binder.

DESCRIPTION OF THE DRAWINGS

FIG. 1A is a cross sectional view of a workpiece after application of the alloying precursor step of the present invention.

FIG. 1B is a cross sectional view of a workpiece during the laser irradiation step of the present invention.

FIG. 1C is a cross sectional view of a workpiece after the laser irradiation step of the present invention.

FIG. 1D is a graph of material concentration as a function of depth in a workpiece prior to irradiation by the process of the present invention. FIG. 1E is a graph of material concentration as a function of depth in a workpiece after irradiation by the process of the present invention.

DESCRIPTION OF THE PREFERRED EMBODIMENTS

A first embodiment of the present invention is directed toward calculating the total laser energy needed to produce a selected laser induced surface modification reaction(s) in a substrate moving relative to a laser beam. The invention comprises selecting a reaction(s) to be induced, selecting the temperature, T, at which each selected reaction shall take place, and determining the free energy of formation, FEF, of each selected reaction at the selected temperature. In a preferred embodiment, the invention may be directed toward a multiplicity of selected reactions. These steps are depicted in blocks 50, 52, and 54 of FIG. 4.

In one preferred embodiment, the selected reaction is:

$$Ti_{(s)} + C_{(s)} \rightarrow TiC_{(s)}. \tag{1}$$

For the reaction shown in equation (1), the FEF is determined using the relationship:

$$FEF = 43750 + 2.41T \text{ Cal/mol}, \tag{2}$$

where T is in the range of 298°–1155° K.

In another preferred embodiment, the selected reaction is:

$$Zr_{(s)} + 1/2 N_{2(g)} \rightarrow ZrN_{(s)}. \tag{3}$$

For the reaction shown in equation (3), the FEF is determined using the relationship:

$$FEF = 87000 + 22.3T \text{ Cal/mol}, \tag{4}$$

where T is in the range of 298°–1135° K.

In another preferred embodiment, the selected reaction rate is:

$$2W_{(s)} + C_{(s)} \rightarrow W_2C_{(s)}, \tag{5}$$

where the FEF is 11700 Cal/mol at T=298° K.

In another preferred embodiment, the selected reaction is:

$$2Co_{(s)} + C_{(s)} \rightarrow Co_2C_{(s)}. \tag{6}$$

For the reaction shown in equation (6), the FEF is determined using the relationship:

$$FEF = 3950 + 2.08T \text{ Cal/mol}, \tag{}$$

where T is in the range of 298°–1200° K.

In a preferred embodiment, any two or more of the above recited reactions may be the selected reactions.

Figure 4:
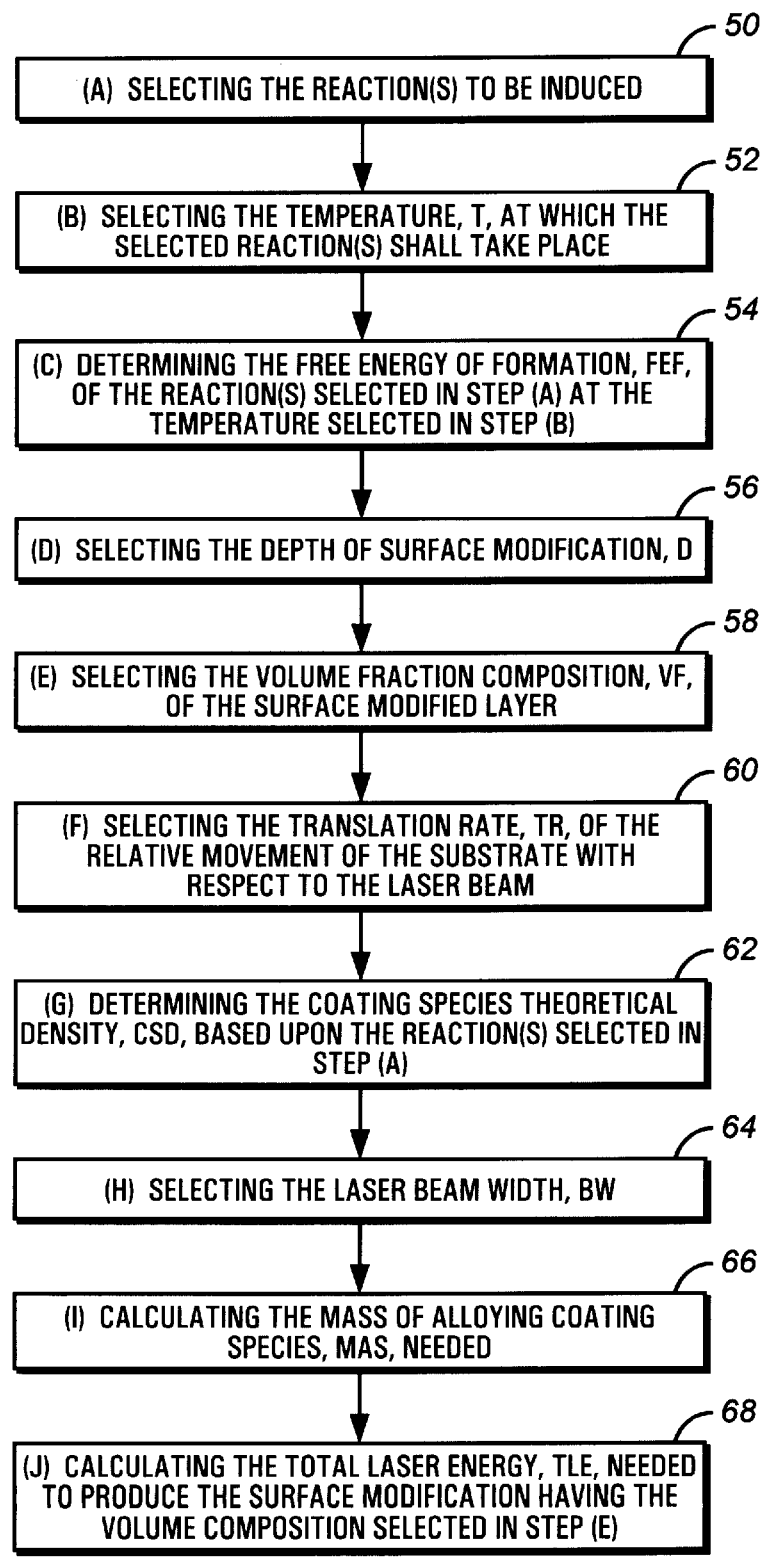
FIG. 4 is a block diagram of a first method of the present invention.

The invention further comprises selecting the depth of the surface modification, D, selecting the volume fraction, VF, of the surface modified layer, and selecting the translation rate, TR, of the relative movement of the substrate with respect to the laser beam, as shown in blocks 56, 58, and 60 of FIG. 4. The phrase "relative movement", as used herein, encompasses movement of the substrate relative to a stationary laser beam, movement of a laser beam relative to a stationary substrate, and movement of both the laser beam and the substrate.

The invention further comprises determining the coating species theoretical density, CSD, based upon each selected reaction, selecting the laser beam width, BW, and calculating the mass of alloying coating species, MAS, needed. These steps are depicted in blocks 62, 64 and 66 of FIG. 4.

In a preferred embodiment, the calculation of MAS is accomplished by solving the following equation:

$$MAS = CSD \times TR \times D \times BW \times VF \tag{7}$$

The method of the present invention further comprises calculating the total laser energy, TLE, needed to produce the surface modification having the volume composition, VF, as shown in block 68 of FIG. 4. In one preferred embodiment, the TLE is calculated using the following equation:

$$TLE = FEF \times CSD \times TR \times D \times BW \times VF \tag{8}$$

In an embodiment where multiple reactions are desired, the TLE for i reactions may be calculated using the following equation:

$$TLE = (TR \times D \times BW) \times [(FEF_1 \times CSD_1 \times VF_1) + (FEF_2 \times CSD_2 \times VF_2) + \ldots (FEF_i \times CSD_i \times VF_i)] \tag{9}$$

The values of TR, D and BW in equation (9) are independent of the selected reaction(s). The values of $FEF_i$, $CSD_i$, and $VF_i$ in equation 9 are reaction specific.

In another preferred embodiment, the TLE is calculated using the following equation:

$$TLE = FEF \times MAS \tag{10}$$

It is evident to those skilled in the algebraic arts that equation (10) is derived by using the relationships defined in equations (7) and (8).

Figure 6:
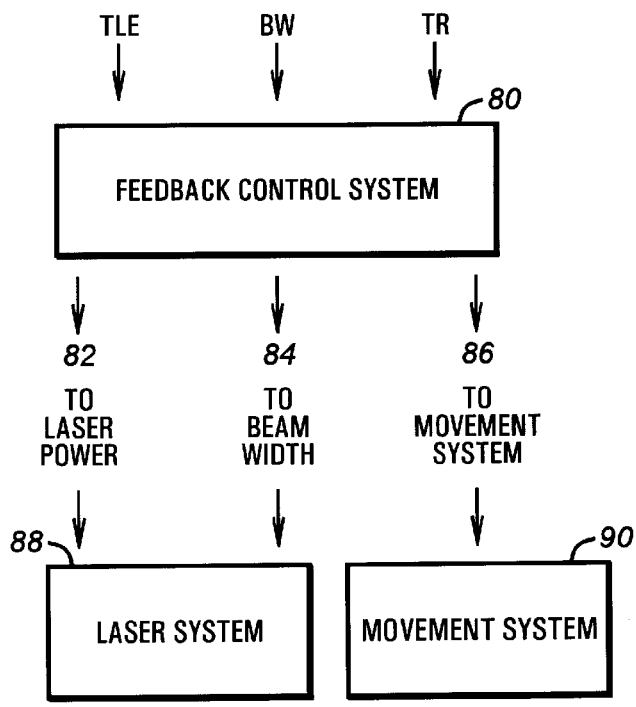
FIG. 6 is a block diagram of the feedback control system of the present invention.

The present invention is also directed toward using the determined TLE to program a feedback control system 80 which can be used to control a process for accomplishing a laser induced surface modification. In this embodiment, the invention comprises inputting the calculated total laser energy and selected beam width into a programmable feedback control system which is operatively coupled to control the power level and beam width of a laser beam system 88 used to induce a surface modification, as shown in block 70 of FIG. 5 and in FIG. 6. In a preferred embodiment, this is accomplished by having the feedback control system output a laser power control signal 82 and a beam width control signal 84, as shown in FIG. 6.

In a preferred embodiment, the control system is operatively coupled to control the speed of a movement system 90 capable of causing relative movement between a substrate whose surface is to be modified and a laser beam. In this preferred embodiment, the selected translation rate is also input into the control system, as shown in FIG. 6. In a preferred embodiment, this is accomplished by having the feedback control system output a movement control signal 86, as shown in FIG. 6.

Another embodiment of the present invention is directed toward using a feedback control system, programmed as described above, to control laser beam power level, beam width, and/or translation rate, for producing a laser induced surface modification. In this embodiment, after the total laser energy is calculated and the control system is programmed, as explained above, a substrate having a material composition compatible with the selected reaction(s) to be induced is coated with a precursor comprising the selected coating species, as shown in block 72 of FIG. 5.

Figure 5:
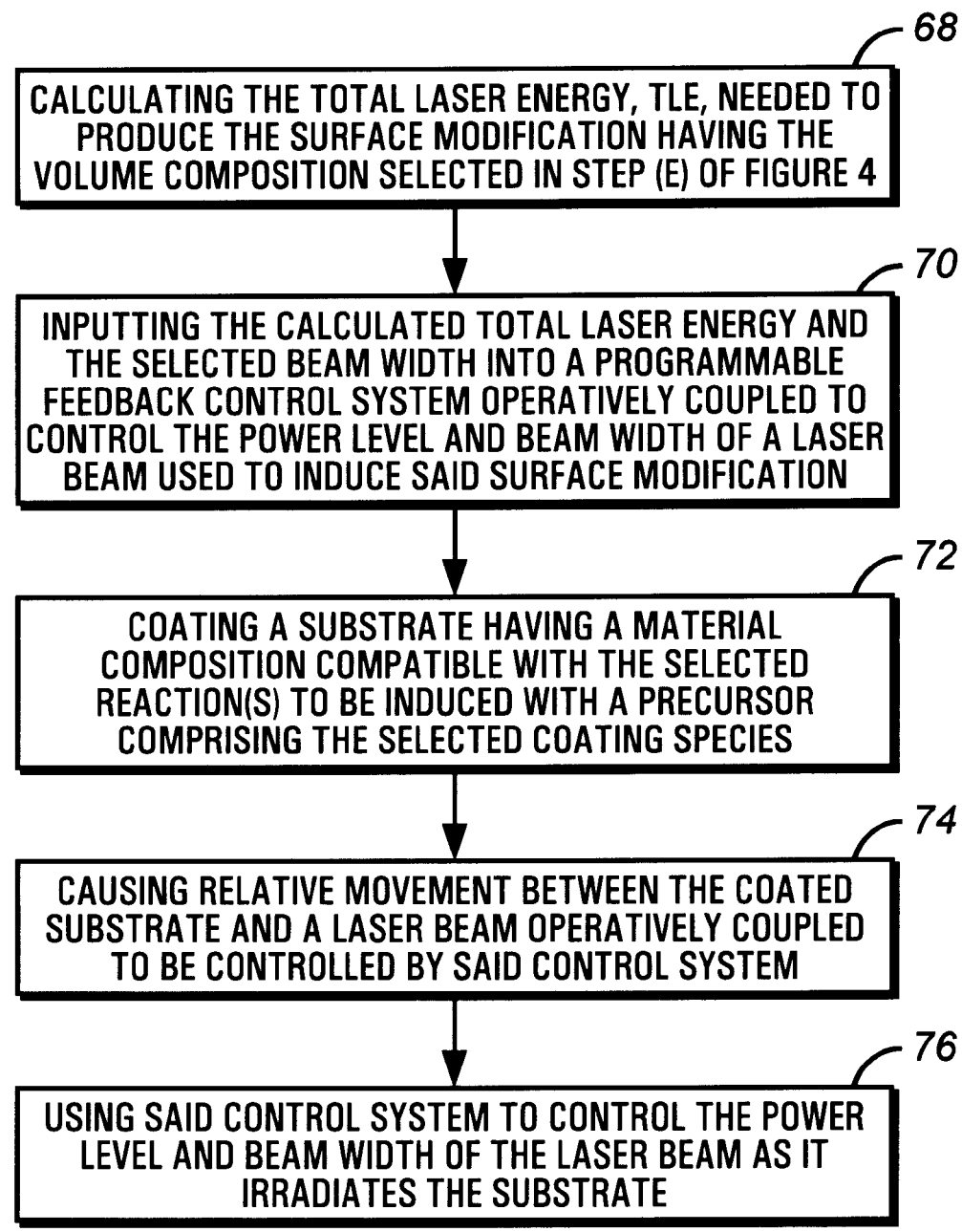
FIG. 5 is a block diagram of a second method of the present invention.

The invention further comprises causing relative movement between the coated substrate and a laser beam operatively coupled to be controlled by the control system, as shown in block 74 of FIG. 5. The invention further comprises using the control system to control the power level and beam width of the laser as it irradiates the substrate, as shown in block 76 of FIG. 5.

In a preferred embodiment, the translation rate has been input into the control system and the control system is used to control the translation rate of the relative movement of the substrate with respect to the laser beam, as shown in FIG. 6.

The resulting product of the present invention is a surface that has been greatly improved. For example, in the case of a steel substrate, a treatment with chromium according to the LISI process yields a product which essentially constitutes a stainless steel equivalent. In such an embodiment, sufficient amounts of chromium and possibly nickel are added to a thin (less than $500\mu$) region of the substrate to make a stainless steel equivalent which is very hard due to the formation of various carbides of chromium.

The resulting stainless steel equivalent is noncorrosive and highly erosion and wear resistant. Therefore, the steel structure can remain in service without the need for periodic replacement, which would require the use of replacement components formed of stainless steel (which is expensive and contains high levels of chromium).

Further, no prior cleaning of the steel substrate is required before applying the process. In fact, a moderate layer of oxide actually can aid in the absorption of the laser beam, thus speeding up the overall process.

The metal to be treated may be any structural metal, including ferrous and non-ferrous materials such as aluminum, nickel, iron or steel. In a preferred embodiment, the substrate metal is plain-carbon steel, also referred to as "mild" steel. The alloying metal, referred to as "precursor alloy material," may be any materials capable of alloying with the structural (substrate) metal and may include chromium, aluminum, zinc, copper, nickel, molybdenum, manganese, cobalt, silicon, tungsten, titanium, carbon and alloys thereof. Other precursor alloy materials which are suitable for the process of the present invention include precious metals such as gold, silver, platinum and palladium. In a preferred embodiment, the precursor alloy material is chromium or an alloy of chromium.

The precursor alloy material may be applied in the form of a powder or as a component of a slurry. In a preferred embodiment, the precursor alloy material is a powder which is mixed with a binder, which may be applied to the metal surface by spraying or painting. The binder may be an organic resin or lacquer or may be a water soluble binder. As described below, the binder is burned off during processing and is, therefore, not present to any significant degree in the final product.

The substrate metal, to which the precursor alloy material has been applied, is heated to a temperature sufficient to cause the substrate metal to melt. As a result, the precursor alloy material mixes and alloys with the molten substrate.

In one embodiment, the precursor alloy material is in the form of a water soluble powder ($CrO_3$). The powder changes color to pink when mixed with water, and can therefore be seen where it is applied. The powder hardens into a thin film upon application. When the film is heated, as described below, the $CrO_3$ dissociates and the chromium mixes with the molten metallic substrate. In another embodiment, the precursor alloy material is Cr, which changes color to gray when applied to the substrate, and which can again be seen where applied.

A laser is preferred as a source of heat to melt the substrate (such as steel) because lasers are capable of producing temperatures sufficient to melt desired substrate materials such as steel, iron, nickel and aluminum, and are capable of being carefully controlled to limit the depth of melting of the substrate and the overall heat input into the bulk material. Lasers useful in the process of the present invention may be any of a variety of lasers which are capable of providing a focused or defocused beam which can melt the precursor alloy material and a portion of the surface and subsurface of the substrate material. Suitable laser sources include $CO_2$ and Nd:YAG lasers.

The YAG laser is preferred over the $CO_2$ laser because the YAG laser may be delivered through fiber optics, which allows for more precise delivery, and because the YAG wavelength is more easily and efficiently absorbed by metals.

The various parameters of the process, including the amount of precursor alloying material and the laser parameters, may be altered as desired to produce an alloy of a particular depth and structure. Also to consider is that some substrates can withstand higher temperatures than other substrates without the formation of cracks and pores. Thus, although a general description of the LISI process is disclosed herein, as well as several specific examples, one skilled in the art will understand that the parameters used may be varied freely based on the substrate material and on the desired result.

The process of the present invention is based on the physical and chemical modification of a surface and subsurface of a metallic material by adding a precursor alloy material and by applying a high energy source, such as a laser. The precursor alloy material is deposited on the surface of the substrate to be treated. Alternatively, as described below, the precursor alloy material maybe provided during and with laser/substrate interaction. The substrate surface and the precursor alloy material are melted by the laser treatment, forming an alloy at the surface and subsurface of the substrate. A shielding gas is preferably provided in the vicinity of the laser/surface interaction region, such as an inert gas (i.e., a gaseous element of the group zero of the periodic system), which may include a reacting or reducing gas such as hydrogen. Following such laser surface treatment, the alloyed region is allowed to cool and solidify, preferably through rapid quenching due to the surrounding (major) portions of the substrate material, which remain cool during the treatment process.

The LISI process has several advantages over conventional methods of treatment of metal surfaces. The process of the present invention is a non-contact process, so there is a complete absence of tool wear and mechanical stresses. The process is rapid. For example, areas of 30–60 $inch^2$/min can be treated using a single laser. The process can be performed on selective and localized regions, which avoids the processing of unnecessary materials and results in savings of cost and time. The process is well suited for remote processing and automation, which minimizes the exposure of personnel to hazards and increases the accuracy of the process.

In addition, the process results in modification of only the surface and the subsurface regions of the substrate, to a depth of one micron to about 2 millimeters. The remainder of the substrate (deep to the modified region) remains unmodified.

The process results in a surface and subsurface alloyed layer which is not a coating, but which is an inherent part of the substrate material with no distinct interface. Thus, problems of delamination or separation of the alloyed region from the remainder of the substrate are obviated.

Very small amounts, even insignificant amounts, of precursor alloying materials are required for the process of the present invention. The amounts of precursor alloying materials needed for protection of the substrate are much less than the amounts needed for a coating or electroplating of the substrate (often reduced by a factor of 2 to 500). Additionally, the process of the invention is a one-time process. That is, there is no need to inspect and re-coat the substrate as is required with traditional coatings.

Further, by varying the composition of the precursor alloying materials and the laser beam parameters, unconventional and non-traditional alloys can be synthesized within the surface and subsurface region of the substrate. As examples, alloys of Al—W, Al—Cr, Ni—Au, Al—Si—C, Al—Ti—C, or Al—W—C can be synthesized in accordance with the present invention.

The LISI process uses the high power density available from a focused or defocused laser source to melt the alloy material and a portion of the underlying material. Since melting occurs rapidly and only at the surface, the bulk of the material remains cool, thus creating rapid selfquenching and solidification. A wide variety of chemical and microstructural states are retained because of the rapid quench from the liquid phase. These include chemical profiles where the alloyed element is highly concentrated near the atomic surface and decreases in concentration over shallow depths, and uniform profiles where the concentration is the same throughout the entire melted region. The types of microstructures observed range from solid solutions with distinct crystalline phases to metallic glasses.

Laser surface treatment has been used to form in-situ Fe—Cr—C alloys on AISI 1018 steel substrates. Such treatment of plain-carbon steel with chromium has produced a fine grain microstructure of ferrite, lath martensite and complex carbide ($M_{23}C_6$) precipitation. The structure of martensite was dislocated and the crystal structure of martensite was bcc. The increase in solid solubility and high cooling rate first produced martensite along with high temperature ferrite, followed by the formation of $M_{23}C_6$ (fcc) carbide precipitate. These carbide precipitates were uniformly distributed in the matrix, which had a high content of chromium. The newly produced alloy in the surface and subsurface region did not show any retained austenite phase. These changes in the plain-carbon steel provided a surface for improved corrosion and wear resistance.

The LISI process may be used on non-corroded, or new metal surfaces to produce a surface and subsurface alloyed region which prevents corrosion, oxidation, hydrogen embrittlement, and wear flash erosion of the substrate. In a preferred embodiment, the metal surface to be treated is plain-carbon steel.

The LISI process may also be used to improve existing metal surfaces, such as steel, which have been corroded. The process of the invention eliminates corrosion which is present and inhibits further corrosion. Thus, the process of the present invention rejuvenates or restores oxidized surfaces and inhibits or prevents further corrosion, oxidation, hydrogen embrittlement and wear flash erosion. The process removes rust and makes the surface rust resistant. In addition, the LISI process further improves the qualities of corroded surfaces, resulting in increased smoothness and wear resistance of the rusted surface. When treating oxidized (corroded or rusted) surfaces by the method of the present invention, it is not necessary to remove the oxidized surface, as is required in the traditional coating techniques. Rust which is firmly attached to the substrate surface may be left on the surface. However, detached or flaking rust should be removed with a soft brush or other suitable means before treatment.

The LISI process may also be used to alloy noble metals such as gold, silver, platinum or palladium, into a metal substrate such as nickel or an alloy thereof, to form a superalloy with a modified surface that has decreased susceptibility to hydrogen embrittlement. The aerospace industry presently applies a gold coating of several hundred microns to nickel surfaces. The LISI process can protect such surfaces with a large savings in cost because the quantity of gold required is only that which is needed to allow the alloying of a few atomic layers of the surface. Only a few microns, such as 1 or even 2 to 5 microns, in depth of the substrate is alloyed with the gold. Thus, because only a very thin gold coating is needed, the process of the present invention allows for a reduction in the amount of gold needed to protect such surfaces by a factor of 2 to 500. In addition, the LISI process allows for further savings of time and money because the process does not have to be repeated, in contrast to traditional coatings, which must be periodically reapplied.

The LISI process may also be used to produce non-traditional alloys in the surface of a metal substrate. In a preferred embodiment, the metal substrate is aluminum or an aluminum alloy and the alloying metal is tungsten, chromium, cobalt, manganese, magnesium or nickel. By varying the parameters of the LISI process (i.e., the composition of the substrate and precursor alloying material and the parameters associated with the laser), different alloys are produced.

The LISI process may also be used, both with $CO_2$ lasers and with Nd:YAG lasers, to improve the surface of an aluminum alloy (e.g., 7075A1) using powders of chromium and of tungsten carbide. The LISI process has also been used to improve the surface of a nickel alloy (marketed under the tradename "Hastelloy," Haynes International, Inc., Kokomo, Ind.) using gold.

In addition to the above discussed uses for the process of the present invention, other utilities will be evident to those skilled in the art from the present disclosure.

The LISI process is depicted schematically in FIGS. 1A, 1B and 1C. Before laser surface treatment, as shown in FIG. 1A, the precursor alloy material 1 is on the surface of the substrate 2, with a distinct interface between the precursor alloy material and the substrate (see FIG. 1D). During laser surface treatment, as shown in FIG. 1B, a high energy laser source 3 (e.g., more than 1 kw for most applications) is directed onto the precursor alloy material layer 1 and the substrate 2, resulting in an alloyed region 4 which has been treated and an unalloyed region 5 which has not been treated. Following laser surface treatment, as shown in FIG. 1C, a resulting alloy species is found within an alloyed region 4 of several microns (e.g., 1 to 500 microns) at the surface of the substrate 2. In the alloyed region 4, reduced substrate material species are present as compared to what is found in regions of the substrate material beneath the alloyed region (see FIG. 1E).

As an example of the foregoing, the LISI process was used to improve the surface of a plain-carbon steel substrate. As previously indicated, such a surface may either be clean or may have a layer of oxide. In the present example, the surface of the substrate was relatively clean, but was not cleaned prior to treatment. Chromium in an organic binder containing methyl ethyl ketone, tetrahydrofuran, toluene and propylene oxide (marketed under the tradename "Microshield," Michigan Chrome & Chemical Co., Hope, Ark.) was applied in a thickness of 0.5 mm ($500\mu$) to the steel substrate. A $CO_2$ laser using a gaussian stationary configuration laser beam with a power of 1.5–2.0 kW and a power density of $50$–$66 \times 10^5$ watts/cm$^2$ was applied to the surface of the substrate at a processing speed of 25 mm/sec to heat the surface of the steel substrate to a temperature sufficient to melt the steel. An argon shielding gas was introduced to the area being treated. The binder was evaporated and removed during processing. A chromium-steel alloyed region with a depth of 0.5 mm to 2.0 mm and having an alloy content of 10 to 45 wt % was produced.

The resulting surface was formed as a surface alloy which is a stainless steel equivalent and which is both noncorrosive and highly erosion and wear resistant. The alloy formed a part of the basic structure of the steel. Consequently, unlike a cladding or a coating, the surface alloy layer will not chip or flake off.

This and other LISI treatments by which the surface of plain-carbon steel has been improved with chromium and other elements are shown in Table 1. The previously described example is shown as "Combination 5" (to the right of Table 1).

constitute a series of mirrors for appropriately directing the beam 12 from the laser 11, through the delivery system 13 and onto the surface 14 of the workpiece 15. In the case of a Nd:YAG laser, the delivery system 13 will primarily constitute of a fiber optic system for receiving the beam 12 from the laser 11, and for appropriately directing the beam 12 onto the surface 14 of the workpiece 15. In the latter case, the convenience of a fiber optic delivery system provides significant versatility and flexibility in implementing the system 10 of the present invention.

Appropriate apparatus is provided for causing relative movement between the delivery system 13 and the workpiece 15. In the examples discussed above, this was accomplished with a movement system 16 for receiving the workpiece 15, and for moving the workpiece 15 relative to the delivery system 13. However, for larger scale

TABLE 1

Operating Conditions for Laser Surface Alloying of Plain-Carbon-Steels with Chromium

| Parameter | Combination 1 | Combination 2 | Combination 3 | Combination 4 | Combination 5 |
|---|---|---|---|---|---|
| Alloy Element | Cr, Cr + C, Cr + C + Mn, Cr + C + Mn + Al | Cr, Cr + Ni | Mo + Cr + Ni + Si | Ni | Cr |
| Method of Application | Slurry in Organic Binder Spray | Sputter Deposit | Slurry in Organic Binder Spray | Electroplate | Deposit of Slurry in Organic Binder |
| Coating Thickness (mm) | 0.025 to 0.75 | 0.002 to 0.018 | not known | 0.001 | 0.5 |
| Laser Power (Kw) | 3.4, 5.0, 12.5 | 7.5 | 8.0 to 12.0 | 4.0 to 6.0 | 1.5 to 2.0 |
| Power Density (W/cm2) | 2800 to 4500 | $10^7$ | 12,500 to 18,750 | 46 to 80 × $10^4$ | 50 to 66 × $10^5$ |
| Processing Speed (mm/s) | 1.69 to 21.17 | 100 to 3750 | 5 to 15 | 25 to 50 | 25 |
| Beam Configuration | Square Top Hat Stationary/Oscillating | Focused/Gaussian Stationary | Square Top Hat Oscillating | not known Stationary | Gaussian |
| Shielding Gas | none, He, He + Ar | He | $CO_2$, Ar, He, $N_2$ | He | $N_2$ |
| Alloy Content (wt %) | 0.9 to 43Cr, 0.5Al, 1.4 to 4.4C, 0.5 to 1.3Mn | 1 to 80 Cr | not known | 0.5 to 3.0 | 10 to 45 |

The alloyed regions of the present invention are typically produced to depths of 500μ (0.5 mm) or less. Typical rates of treatment (i.e., beam movement) are on the order of one inch/second. Thus, by the LISI process, regions of about 6 square feet or more can be processed in one hour. To obtain faster rates of treatment, if desired, additional lasers may be used, or plural beams may be derived from a single laser source.

One skilled in the art will understand from this disclosure that the values for power density and processing speed which together provide appropriate cooling rates to produced required phase(s) will be the function of several related process and material parameters such as substrate material (content of carbon and/or other alloying element), method of application, amount of surface alloying material at the laser/substrate zone, beam configuration (square/rectangular (top hat), focused/gaussian, stationary/oscillating), and shielding gas, among others.

Figure 2:
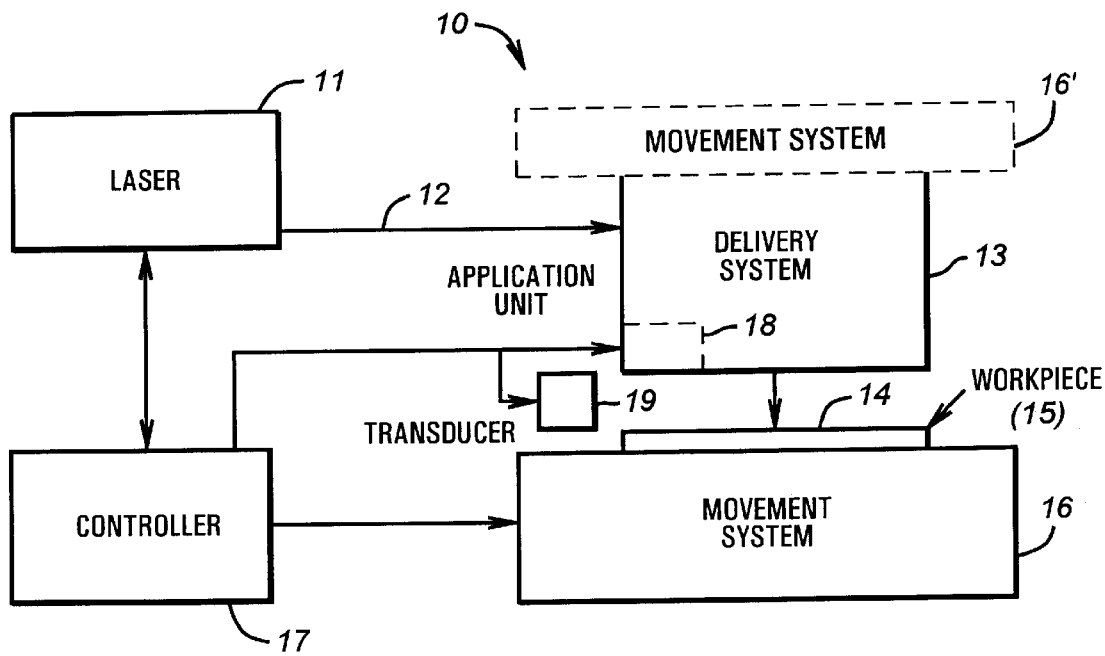
FIG. 2 is a block diagram of a system for implementing the process of the present invention.

FIG. 2 schematically illustrates a system 10 for accomplishing laser induced surface improvement in accordance with the present invention. The system 10 includes a laser 11, which may be a $CO_2$ laser, a Nd:YAG laser, or equivalent (or an equivalent heat source) for producing a collimated beam (schematically represented at 12) in known fashion. A delivery system 13 is provided for receiving the beam 12, for appropriate delivery to the surface 14 of a workpiece 15. In the case of a $CO_2$ laser, the delivery system 13 will primarily applications, it is preferable to provide a movement system 16' which is associated with the delivery system 13, for causing movements of the delivery system 13 relative to the workpiece 15. This latter configuration is particularly preferred for applications where movement of the workpiece may be impractical, and is presently considered to be a preferred-means for establishing relative movement between the delivery system 13 and the workpiece 15 in larger scale, commercial applications.

A controller or control system 17 communicates with the laser 11, the delivery system 13, and the movement system 16 (or 16'), for purposes of controlling these components, as well as their interaction with one another. For example, the controller 17 communicates with the laser 11 for purposes of controlling the various operating parameters of the laser, such as output power, wave shape, wave length and pulsing of the beam 12. Similarly, the controller 17 communicates with the delivery system 13 for purposes of controlling the delivered beam, primarily its focusing relative to the surface 14 of the workpiece 15. The controller 17 also communicates with the movement system 16 (or 16') for purposes of regulating relative movement between the delivery system 13 and the workpiece 15, such as rate of speed and direction.

As previously indicated, the alloying material can be delivered to the workpiece 15 in a variety of different ways. In the event that the alloying material is sprayed or otherwise delivered to the surface 14 of the workpiece 15 as the surface is lased, an application unit 18 is provided, preferably as part of or in association with the delivery system 13. In such case, the controller 17 communicates with the application unit 18 to regulate the rate of application (e.g., the delivery of a power) of alloying material to the surface 14 of the workpiece 15.

As a practical illustration of laser induced surface improvement in accordance with the present invention, surface alloying has been accomplished with a Model RS3000 (Rofin-Sinar) laser, which is a fast axial flow, radio frequency (27.12 MHZ) excited, $CO_2$ (10.6 $\mu$m wavelength) laser capable of operating at average power levels ranging from 0.2 to 3.7 kW (the laser 11). The RS3000 laser was coupled with a Model RS3000 welding head (Rofin-Sinar), including 150 mm, f/6 optics and circular polarization. The resulting beam was operated in the $TEM_{10}$ mode using a standard pulse configuration (SPC). In this standard pulse configuration, the beam was pulsed at 5 kHz and the average beam power was adjusted by changing the duty cycle of the pulse (i.e., a quasi-continuous wave mode of operation). Pure nitrogen was introduced in the vicinity of the workpiece 15, in a direction coaxial to the laser beam and at a rate of approximately 4 liters/min, to serve as a shielding gas.

Figure 3A:
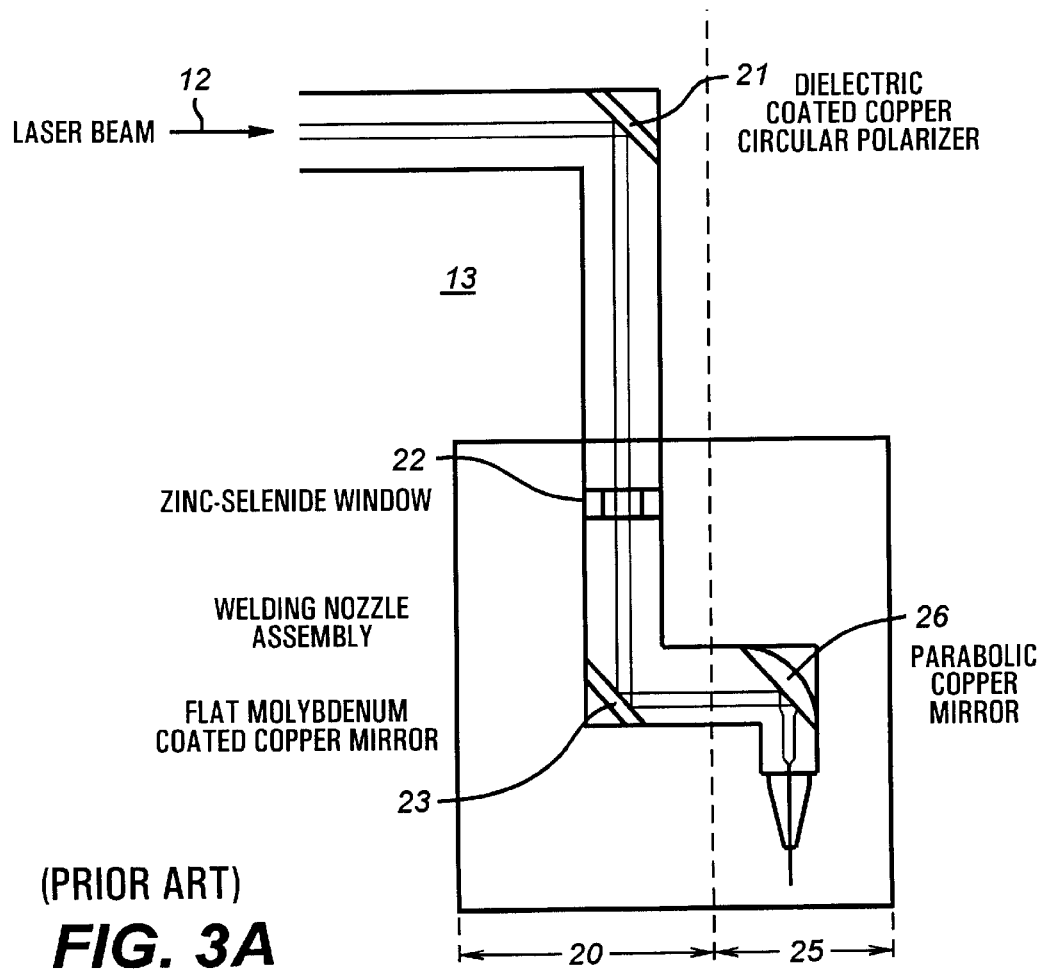
FIG. 3A is a cross-sectional view of a typical laser delivery system.
Figure 3B:
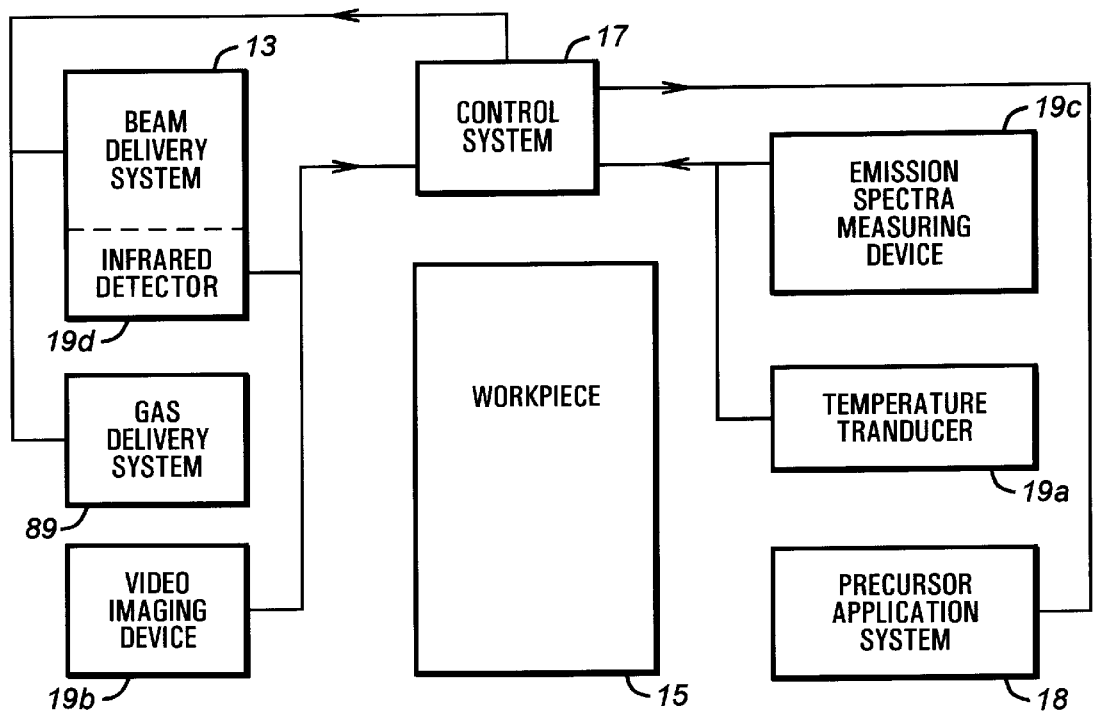
FIG. 3B is a block diagram of an embodiment of the present invention.

In this configuration, a delivery system 13 appropriate to a $CO_2$ laser was used, and is schematically shown in FIG. 3 of the drawings. The illustrated delivery system 13 included a first section 20 having optics for appropriately directing the laser beam. This would include conventional expedients such as the dielectric-coated copper circular polarizer 21, the zinc-selenide window 22, and the flat molybdenum-coated copper mirror 23 shown in the figure. The optics section 20 communicates with a second, focusing section 25, which operates to ultimately direct the laser beam onto the surface 14 of the workpiece 15.

To this end, the focusing section 25 includes a parabolic copper mirror 26 which is capable of adjusting the 'focus of the laser' beam, as desired.

The workpiece 15 was mounted on a computer numeric controlled (CNC), 5-axis UNIDEX-16 workstation (AEROTECH), for constant linear translation (the movement system 16). To this end, a steel plate was positioned for receiving a laser beam focused at 25 mm above the surface of the workpiece. Laser treatment was conducted with an average beam power of 2000 watts, providing an energy (power density) of about 100 watts/mm² at the surface of the workpiece. To treat the entire area, the workpiece was translated under the laser beam at a rate of 1500 mm/min. and an overlap of 20% (i.e., about 1 mm for a 5 mm width laser track). This rate was maintained throughout the treatment of the workpiece.

In this configuration, AISI 1010 carbon steel plate (250 mm×2S0 mm×6 mm in dimension) was treated to receive a laser surface alloy layer of chromium. A commercially available lacquer (marketed under the tradename "Microshield," TOBLER Division, Hope, Ark.) was used as an organic binding vehicle for the chromium. A suspension of chromium powder (average 5 $\mu$m particle size, 99.6% pure, from CERAC, Milwaukee, Wis.) in a solution of 5 vol % of the lacquer in acetone was hand brush painted as a thin, flat and uniform layer on the steel plate. The deposited mixture of chromium and organic binder vehicle was thoroughly dried in air prior to the laser treatment. The steel (substrate) plate was cleaned with methanol and dried in air prior to deposition of the chromium layer. This resulted in a layer of chromium having a thickness of about 50 $\mu$m.

The treated AISI 1010 steel plate exhibited fairly uniform surface alloyed regions. Initial observations both in transverse and cross-section under optical as well as scanning electron microscope indicated the creation of a very sound (crack and pore free) layer. The thickness of the alloyed region was about 1.23 mm with an average chromium concentration of 5 wt %. Etching of the alloyed sample in cross-section with a solution of 5 vol % concentrated nitric acid in methanol produced a chemically attacked, dull surface in the substrate material. However, it failed to attack the alloyed region, which remained mirror-like. Such response indicates the transformation of the surface into a corrosion resistant surface.

The surface alloyed region was also tested for physical integrity with the substrate by subjecting the sample to various mechanical loading conditions. The laser alloyed sample was subjected to static cantilever bend testing. The sample was bent through 110° under a normal force of 250 lbs without any delamination or cracking under tension. Even though the sample was also subjected to repeated dynamic area (circular), line and point contact loading, there were no indications of any separation from the substrate, or cracking. A sound, mechanically strong and chemically resistant alloyed layer was produced at the AISI 1010 steel surface.

The previously described components are capable-of variation in accordance with the present invention, and for purposes of achieving a useful result in conjunction with different applications. For example, and as previously mentioned, different lasers may be used for implementing the laser 11 of FIG. 2. One such example is the Nd:YAG laser, which is of interest due to the greater flexibility which it affords in terms of its corresponding delivery system.

As a practical illustration, surface alloying has been accomplished with a JK-701 laser (Lumonics), which is a pulsed Nd:YAG laser (1.06 $\mu$m wavelength) with a lasing medium comprised of a single crystal yttrium-aluminum-garnet doped with neodymium. The output beam was coupled to a 15 foot fiber optic cable (which scrambles the intensity profile), resulting in a laser beam of near top-hat intensity in profile ($TEM_{00}$ mode). The beam emitted from the fiber optic cable was focused by a lens (75 mm focal length) to a spot diameter of 400 $\mu$m. The JK-701 laser was operated to deliver pulses with a maximum average power of 400 watts and an energy per pulse of 55 Joules. Pulse duration was varied from 0.5 to 20 milliseconds, with pulse rates up to 500 Hz. The exact shape, size and energy of each pulse was obtained by adjusting the duration (width), amplitude (height) and frequency using the control panel.

A chromium coated steel plate was mounted on a computer numeric controlled (CNC) two-axis workstation (TECHNO, a DSG Company, New Hyde Park, N.Y.) having lead screw operated X and Y stages (2 mm/rev), motor (200 full step/rev);and driver (10 microstep/step) providing a maximum of 30 mm traverse in both orthogonal directions, with a maximum of 50 cm/sec traverse speed. The plate was positioned to receive a beam focused at 2.6 mm below the surface. Laser treatment was conducted at 9.5 Joules (pulse power) for 18 milliseconds (pulse duration) at a 20 Hz pulse repetition rate. These settings provided about 20 watts/mm² energy at the surface of the plate. To cover the entire area, the sample was translated under the laser beam at a traverse speed of 360 mm/min and an overlap of 40% (i.e., about 0.4 mm for a 1 mm diameter beam spot) between successive spots and an overlap of 20% (i.e., about 0.2 mm for 1 mm wide laser track) between successive tracks. Such conditions were maintained throughout the treatment. Pure nitrogen was introduced in the vicinity of the workpiece, in a direction coaxial to the laser beam and at a rate of approximately 4 liters/min, to serve as a shielding gas.

AISI 1010 carbon steel plate (250 mm×250 mm×6 mm in dimension) was treated to receive a laser surface alloy layer of chromium. A commercially available lacquer (marketed under the tradename "Microshield," TOBLER, Hope, Ark.) was used as an organic binding vehicle for the chromium. A suspension of chromium powder (average 5 $\mu$m particle size, 99.6% pure, from CERAC, Milwaukee, Wis.) in a solution of 5 vol % of lacquer in acetone was hand brush painted as a thin, flat and uniform layer on the steel plate. The deposited mixture of chromium and organic binder vehicle was thoroughly dried in air prior to the laser treatment. The steel (substrate) plate was cleaned with methanol and dried in air prior to deposition of the chromium layer. This resulted in a layer of chromium having a thickness of about 50 $\mu$m.

The use of Nd:YAG lasers affords various improvements in the overall LISI process. Primarily, this results from the ability of Nd:YAG lasers to communicate with fiber optic delivery systems (and because the wavelengths produced are better absorbed by the workpiece). The size of the laser necessary to effectively treat a surface in accordance with the present invention can be on the order of 2000 pounds, making it difficult to move the laser relative to the surface to be treated. However, with a fiber optic delivery system, the laser can remain external to the region being treated and the laser beam can be delivered to the surface with fiber optics. The fiber optics and the associated beam manipulator (i.e., the delivery system 13 for focusing and shaping the beam into its desired configuration) are relatively small and are therefore easily handled (e.g., using suitable robotics and associated controllers). Standard length fibers are on the order of 100 to 250 meters, and separate fibers can be joined together to achieve longer extensions.

The movement system 16' which can be used with fiber optics will be significantly simpler due to the lighter fiber optics and beam manipulators which are required. As a result, all that is required to achieve a useful result is to move the end of the fiber optics (the beam manipulator) along the surface to be treated, while maintaining a proper distance from the beam manipulator to the surface.

Such movement can be accomplished in conjunction with adjustments of the configuration of the laser beam, from focused, essentially parallel light to unfocused configurations (which is also possible for the $CO_2$ lasers). For this reason, the distance from the beam manipulator to the surface of the workpiece is not critical, and can vary by several centimeters, further simplifying control of the movement system and the associated laser beam. Although, as previously indicated, $CO_2$ lasers can provide useful laser induced surface improvement, the use of such lasers is presently considered to be less desirable since the beam delivery systems which they require (mirrors and the like), while feasible, are somewhat more difficult to implement on a practical basis. Nevertheless, such systems can be used to achieve an equally useful result.

Corresponding modifications may be made to the delivery system 13, the movement system 16 (or 16') and the controller 17. For example, a fiber optic delivery system is preferably used in conjunction with the Nd:YAG laser previously described. Essentially, the delivery system 13 will be selected to provide an interface with whatever type of laser 11 (or equivalent heat source) is selected for a particular application.

The movement system 16 (or 16') is similarly capable of variation to suit a particular application. This can include any of a variety of available movement systems such as 2-axis linear motion systems, 1-axis linear and 1-axis rotary systems, combined 1–3 linear and 1–3 rotary stages, fully articulated (multi-degree of freedom) robotic delivery systems and multi-access "crawler" mechanisms. As previously indicated, such movement systems may either be associated with the workpiece 15 (the movement system 16) or with the delivery system 13 (the movement system 16').

Application systems capable of modifying the surface of large structures can take several forms, for purposes of accessing remote areas and for traversing large distances and irregular surfaces. For large regions with no restrictions in access, an articulated robotic arm mounted on a moving base can be used to easily reach floor, wall and ceiling surfaces. Such a system would be programmed to follow the surface geometry and any irregularities present (preferably in conjunction with a height sensor incorporated into the motion control system) to provide consistent processing conditions over the structure. The processing head at the end of the arm could also house other diagnostics for process control, if desired.

For small regions and for regions with limited access, smaller robotic arms can be deployed within the structure, or a miniature delivery head can be deployed for traversing the surface (like a mouse). Tracking systems for such devices are known, and are currently used for pipe welding (and use either a magnet or a track system to process wall and ceiling surfaces). Any track system needed can be physically mounted, using a scaffolding structure or magnets. Miniaturized diagnostics can be incorporated into the delivery head, as with the larger robotic arms.

The relative insensitivity of the LISI process to operating conditions makes it possible to implement hand-held manual operations for appropriate applications (e.g., around air duct valves, flow straighteners, drains, and access ports). This would be used in cases of extreme inaccessibility, and for irregular structures and surfaces. Much as in welding, a human operator would process the surface using sensory feedback and skilled process tracking.

Irrespective of implementation, an important aspect relative to processing speed is the shape of the beam and how the beam is used to process a surface. The above-described examples employed fixed, circular beams which decayed smoothly to zero intensity at their edges. However, other systems may employ beams with rectangular or line-like beam shapes or with very sharp intensity profiles (much like a wide paint brush or roller). These profiles will allow finer control of the process and faster processing speeds.

Such beam profiles can be used in conjunction with a scanning mirror arrangement, as is used in some cosmetic laser surgery applications. Such systems use rotating or vibrating mirrors to very rapidly scan an area of desired shape (and which is generally much larger than the beam size) as the beam is traversed over the processed area. This gives an effect of shaping the beam area, making the beam effectively larger. Suitable control of the scanning frequency provides for correct interaction time.

The controller 17 may include any of a variety of systems and subsystems for controlling the laser 11, the delivery system 13 and the movement systems 16, 16', as needed. For example, the previously described movement system 16 (CNC:AEROTEC UNIDEX-16) employs a 6-axis CNC motion control system coupled with an appropriate laser firing card. Coupled with this motion control system 17 is a PC-based, multi-axis control system (either with a laser firing control card or slaved to the laser control system). Alternatively, an independent processor (multi-axis control system) may be used, which is either mastered to an external laser control system or which is slaved to the external laser control system.

It will be understood that control of the foregoing apparatus, and the process which it implements, is an important part of the laser induced surface improvement of the present invention. As previously indicated, suitable control of the apparatus and its corresponding process have been achieved with a PC-based feedback control system, operating as a master for controlling the laser 11 and the movement system 16 (or 16'). The use of a programmable logic control (PLC) feedback control system is preferred, in combination with an independent, single card feedback control system.

The overall function of the controller 17 is to ensure that the system is functioning appropriately to melt the surface of the substrate to a proper depth, thereby ensuring that the correct alloy is made at the surface. The controller 17 primarily accomplishes this by regulating the power of the laser 11, focusing of the laser beam using the focusing portions 25 of the delivery system 13, and the speed of the movement system 16, 16'. Other parameters associated with the process, such as the application unit or precursor application system 18 (if used) and any associated gas flow rates (i.e., shielding gas), may also be controlled responsive to signals received from the controller 17, if desired, as shown by the gas delivery system 89 in FIG. 3B.

Further, and referring to FIG. 2, a variety of transducers 19 may be placed in the vicinity of the laser delivery system 13 and the workpiece 15 to further interface with the controller 17 and to better control the apparatus and its corresponding process. Suitable transducers 19 for accomplishing such a result include the following.

Temperature measurements are useful in determining the overall efficiency of energy transfer from the laser beam to the workpiece. Such temperature measurements can be used to provide feedback for purposes of modifying the operating parameters of the laser, primarily the power of the laser beam (sample rate), and/or the transport speed of the movement system. Examples of transducers 19a for accomplishing such temperature measurements would include contact temperature measurement of the workpiece and of the environment (surrounding the laser/surface interaction region) in the vicinity of the workpiece, as well as pyrometric temperature measurement of the surface of the workpiece (near the laser/surface interaction region). Video imaging of the laser/surface interaction region is also useful in providing proper positioning of the laser beam relative to the surface of the workpiece. Images obtained at a high shutter speed (using techniques which are themselves known) are useful in providing a clear indication of the location of the laser/surface interaction region, and such data can be used to provide feedback control of laser beam movement, as shown by the video imaging device 19b in FIG. 3B.

Emission spectra emanating from the plasma which is conventionally formed in the laser/surface interaction zone are useful in providing data concerning vapor temperature and species concentration, which have been found to be related to the quality of the overall process. For example, the detection of a low temperature may indicate that the depth of the alloyed surface is undesirably excessive. Emitted spectra related to temperature measurements can be monitored and used to adjust operating parameters of the laser beam (sample rate) and/or the transport speed of the movement system, as shown by the emission spectra measuring device 19c in FIG. 3B.

Acoustic signals are produced at the surface of the workpiece, and are related to the geometry and physical dynamics of the overall process. As the surface properties (of the molten liquid) change with depth, responsive to changes in the composition, the motion of the resulting melt and the acoustic signals which are produced will differ. Such changes can again be used to provide feedback for controlling the depth of the treated surface by controlling operating parameters of the laser beam (sample rate) and/or the transport speed of the movement system.

Other parameters can be monitored to provide an indication of the overall improvement of the resulting process. For example, laser power can be monitored using an infrared detector to measure fluctuations in laser power, which can provide information related to expected success. Since the surface depth produced may be too small at low laser power levels, limits on laser power can be used as an acceptable criteria for dynamic monitoring of the overall process. Humidity measurements made near the laser/surface interaction region can similarly be used to monitor the environment for acceptable operating conditions.

The foregoing disclosure and description of the invention are illustrative and explanatory. Various changes in the size, shape, and materials, as well as in the details of the illustrative embodiments may be made without departing from the spirit of the invention.

What is claimed is:

1. A method of calculating the total laser energy needed to produce a selected laser induced surface modification reaction in a substrate moving relative to a laser beam, comprising:
   a. selecting a reaction to be induced;
   b. selecting the temperature, T, at which the selected reaction shall take place;
   c. determining the free energy of formation, FEF, of the reaction selected in step (a) at the temperature selected in step (b);
   d. selecting the depth of surface modification, D;
   e. selecting the volume fraction composition, VF, of the surface modified layer;
   f. selecting the translation rate, TR, of the relative movement of the substrate with respect to the laser beam;
   g. determining the coating species theoretical density, CSD, based upon the reaction selected in step (a);
   h. selecting the laser beam width, BW;
   i. calculating the mass of alloying coating species, MAS, needed;
   j. calculating the total laser energy, TLE, needed to produce the surface modification having the volume composition selected in step (e); and
   k. inputting the total laser energy, TLE, and beam width, BW, into a programmable feedback control system operatively coupled to control the power level and beam width of a laser beam used to induce said surface modification.

2. The method of claim 1, wherein said calculating the mass of alloying coating species needed, MAS, is accomplished by solving the following equation:

$$MAS = CSD \times TR \times D \times BW \times VF.$$

3. The method of claim 1, wherein the reaction selected in step (a) is:

$$Ti_{(s)} + C_{(s)} \rightarrow TiC_{(s)}.$$

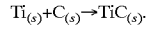

4. The method of claim 3, wherein said determining the free energy of formation, FEF, is accomplished using the relationship:

$$FEF = 43750 + 2.41T \text{ Cal/mol},$$

where T is in the range of 298°–1155° K.

5. The method of claim 1, wherein the reaction selected in step (a) is:

$$Zr_{(s)} + 1/2 N_{2(g)} \rightarrow ZrN_{(s)}.$$

6. The method of claim 5, wherein said determining the free energy of formation, FEF, is accomplished using the relationship:

$$FEF = 87000 + 22.3T \text{ Cal/mol},$$

where T is in the range of 298°–1135° K.

7. The method of claim 1, wherein the reaction selected in step (a) is:

$$2W_{(s)} + C_{(s)} \rightarrow W_2C_{(s)},$$

where the FEF is 11700 Cal/mol at T=298° K.

8. The method of claim 1, wherein the reaction selected in step (a) is:

$$2Co_{(s)} + C_{(s)} \rightarrow Co_2C_{(s)}.$$

9. The method of claim 8, wherein said determining the free energy of formation, FEF, is accomplished using the relationship:

$$FEF = 3950 + 2.08T \text{ Cal/mol},$$

where T is in the range of 298°–1200° K.

10. The method of claim 1, wherein said calculating the total laser energy, TLE, is accomplished by solving the following equation:

$$TLE = FEF \times MAS.$$

11. The method of claim 1, wherein said calculating the total laser energy, TLE, is accomplished by solving the following equation:

$$TLE = FEF \times CSD \times TR \times D \times BW \times VF.$$

12. The method of claim 1, wherein said control system is further operatively coupled to control the speed of a movement system capable of causing relative movement between said substrate and said laser beam, and further comprising inputting the selected translation rate, TR, into said control system.

13. The method of claim 12, wherein said control system is further operatively coupled to a precursor delivery system capable of controlling the rate of delivery of a precursor comprising the selected coating species.

14. The method of claim 1 wherein:
a. said selecting a reaction comprises selecting a multiplicity of reactions;
b. said selecting the temperature is carried out for each selected reaction;
c. said determining the value of FEF is carried out for each selected reaction;
d. said determining the value of CSD is carried out for each selected reaction; and
e. said selecting the value of VF is carried out for each selected reaction.

15. The method of programming a feedback control system used to control the depth and chemistry of a selected laser induced surface modification reaction in a substrate moving relative to a laser beam or a laser beam moving relative to a substrate, comprising:
a. selecting a reaction to be induced;
b. selecting the temperature, T, at which the selected reaction shall take place;
c. determining the free energy of formation, FEF, of the reaction selected in step (a) at the temperature selected in step (b);
d. selecting the depth of surface modification, D;
e. selecting the volume fraction composition, VF, of the surface modified layer;
f. selecting the translation rate, TR, of the relative movement of the substrate with respect to the laser beam;
g. determining the coating species theoretical density, CSD, based upon the reaction selected in step (a);
h. selecting the laser beam width, BW;
i. calculating the mass of alloying coating species, MAS, needed;
j. calculating the total laser energy, TLE, needed to produce the surface modification having the volume composition selected in step (e);
k. inputting the calculated total laser energy and the selected beam width into a programmable feedback control system operatively coupled to control the power level and beam width of a laser beam used to induce said surface modification;
l. coating a substrate having a material composition compatible with the selected reaction to be induced with a precursor comprising the selected coating species;
m. causing relative movement between the coated substrate and a laser beam operatively coupled to be controlled by said control system; and
n. using said control system to control the power level and beam width of the laser beam as it irradiates the substrate.

16. The method of claim 15, further comprising:
a. inputting the translation rate, TR, into said control system; and
b. using said control system to control the translation rate of the relative movement of the substrate with respect to the laser beam.

17. The method of claim 15, wherein said calculating the mass of alloying coating species needed, MAS, is accomplished by solving the following equation:

$$MAS = CSD \times TR \times D \times BW \times VF.$$

18. The method of claim 15, wherein said calculating the total laser energy, TLE, is accomplished by solving the following equation:

$$TLE = FEF \times CSD \times TR \times D \times BW \times VF.$$

* * * * *